United States Patent
Zhou et al.

(10) Patent No.: US 10,566,050 B1
(45) Date of Patent: Feb. 18, 2020

(54) SELECTIVELY DISCONNECTING A MEMORY CELL FROM A POWER SUPPLY

(71) Applicant: Xilinx, Inc., San Jose, CA (US)

(72) Inventors: Shidong Zhou, Milpitas, CA (US); Nui Chong, San Jose, CA (US); Jing Jing Chen, San Jose, CA (US)

(73) Assignee: XILINX, INC., San Jose, CA (US)

(*) Notice: Subject to any disclaimer, the term of this patent is extended or adjusted under 35 U.S.C. 154(b) by 0 days.

(21) Appl. No.: 15/927,797

(22) Filed: Mar. 21, 2018

(51) Int. Cl.
| | |
|---|---|
| *G11C 11/00* | (2006.01) |
| *G11C 11/419* | (2006.01) |
| *G11C 11/412* | (2006.01) |
| *G11C 11/418* | (2006.01) |

(52) U.S. Cl.
CPC .......... *G11C 11/419* (2013.01); *G11C 11/412* (2013.01); *G11C 11/418* (2013.01)

(58) Field of Classification Search
CPC .... G11C 11/419; G11C 11/412; G11C 11/418
USPC ........................................................ 365/156
See application file for complete search history.

(56) References Cited

U.S. PATENT DOCUMENTS

| | | | |
|---|---|---|---|
| 4,750,155 A | 6/1988 | Hsieh | |
| 4,821,233 A | 4/1989 | Hsieh | |
| 6,008,673 A * | 12/1999 | Glass | G11C 7/062 327/55 |
| 6,044,012 A | 3/2000 | Rao et al. | |
| 6,137,714 A | 10/2000 | Voogel | |
| 6,243,294 B1 | 6/2001 | Rao et al. | |
| 6,266,269 B1 | 7/2001 | Karp et al. | |
| 6,373,279 B1 | 4/2002 | Bauer et al. | |
| 6,445,209 B1 | 9/2002 | Young et al. | |
| 6,496,416 B1 | 12/2002 | Look | |
| 6,522,582 B1 | 2/2003 | Rao et al. | |
| 6,549,458 B1 | 4/2003 | Rao et al. | |
| 6,671,205 B2 | 12/2003 | Look | |
| 7,109,746 B1 | 9/2006 | Voogel et al. | |
| 8,462,541 B2 * | 6/2013 | De | G11C 5/063 365/154 |
| 2012/0049374 A1 * | 3/2012 | Chang | G11C 11/412 257/773 |

* cited by examiner

*Primary Examiner* — Vu A Le
(74) *Attorney, Agent, or Firm* — Patterson + Sheridan, LLP

(57) ABSTRACT

Embodiments herein describe a memory cell (e.g., a SRAM memory cell) that includes power selection logic for disconnecting storage inverters from a reference voltage source when writing data into the cell. In one embodiment, the memory cells may be disposed long distances (e.g., more than 100 microns) from the data drivers in the integrated circuit which can result in the data lines having large RC time constants. In one embodiment, disconnecting the memory cells from a power supply may counter (or mitigate) the large RC time constants of the data lines.

20 Claims, 11 Drawing Sheets

SELECTIVELY DISCONNECTING A MEMORY CELL FROM A POWER SUPPLY

TECHNICAL FIELD

Examples of the present disclosure generally relate to a memory cell and, in particular, to selectively disconnecting the memory cell from a reference voltage source when writing data to the cell.

BACKGROUND

In some integrated circuits, a memory cell may be disposed a large distance (e.g., 100 microns or more) from a data or address driver used to transmit or read data from the memory cell. That is, the memory cell may have long data or address lines that connect the cell to the data and address drivers. These long data and address lines have large RC time constants which can slow down the write/read speeds or reduce the write margins. To overcome the RC time constants (and improve speeds and write margins), the voltage on the address lines can be increased; however, this only improves the RC time constant at the pass gates in the memory cell which may not be sufficient to counter the detrimental RC time constant of the data lines.

Instead, one or more buffers (e.g., simplified driver circuits) can be disposed along the length of the data lines between the data driver and the memory cell. However, the circuitry in the buffers takes up space and increases the complexity of the integrated circuit. Further, it may be impossible or difficult to test the buffers to ensure their proper operation. If a buffer malfunctions, this may prevent the connected memory cell or cells from operating properly. Thus, developing memory cells that are immune to, or mitigate, the detrimental RC constants from long data lines, and thus, do not need buffers in the data lines, can reduce cost and complexity of an integrated circuit.

SUMMARY

Techniques for storing data in a memory cell are described. One example is a memory cell that includes at least one data line, at least one address line, and a pair of storage inverters where an output of a first inverter is coupled to an input of a second inverter and an output of the second inverter is coupled to an input of the first inverter to save a state of the pair of storage inverters. The memory cell also includes power selection logic coupled between a reference voltage source and the pair of storage inverters where the memory cell is configured to disconnect, during a write operation, at least one of the pair of storage inverters from the reference voltage source using the power selection logic and drive desired data on the at least one data line when the at least one of the pair of storage inverters is disconnected from the reference voltage to flip the state of the pair of storage inverters.

One example described herein is a method that includes disconnecting, during a write operation, at least one of a pair of storage inverters in a memory cell from a reference voltage source using power selection logic where an output of a first inverter is coupled to an input of a second inverter and an output of the second inverter is coupled to an input of the first inverter to save a state of the pair of storage inverters, and where the power selection logic is coupled between the reference voltage source and the pair of storage inverters. The method also includes driving desired data on a data line when the at least one of the pair of storage inverters is disconnected from the reference voltage to flip the state of the pair of storage inverters.

One example described herein is a memory cell that includes a first inverter, a second inverter where an output of the first inverter is coupled to an input of a second inverter and an output of the second inverter is coupled to an input of the first inverter to save a state of the memory cell, and a transistor coupled at a first end to a reference voltage source and coupled at a second end to both the first and second inverters. The memory cell is configured to disconnect, during a write operation, both the first and second inverters from the reference voltage source using the transistor.

BRIEF DESCRIPTION OF THE DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

To facilitate understanding, identical reference numerals have been used, where possible, to designate identical elements that are common to the figures. It is contemplated that elements of one example may be beneficially incorporated in other examples.

DETAILED DESCRIPTION

Figure 1:
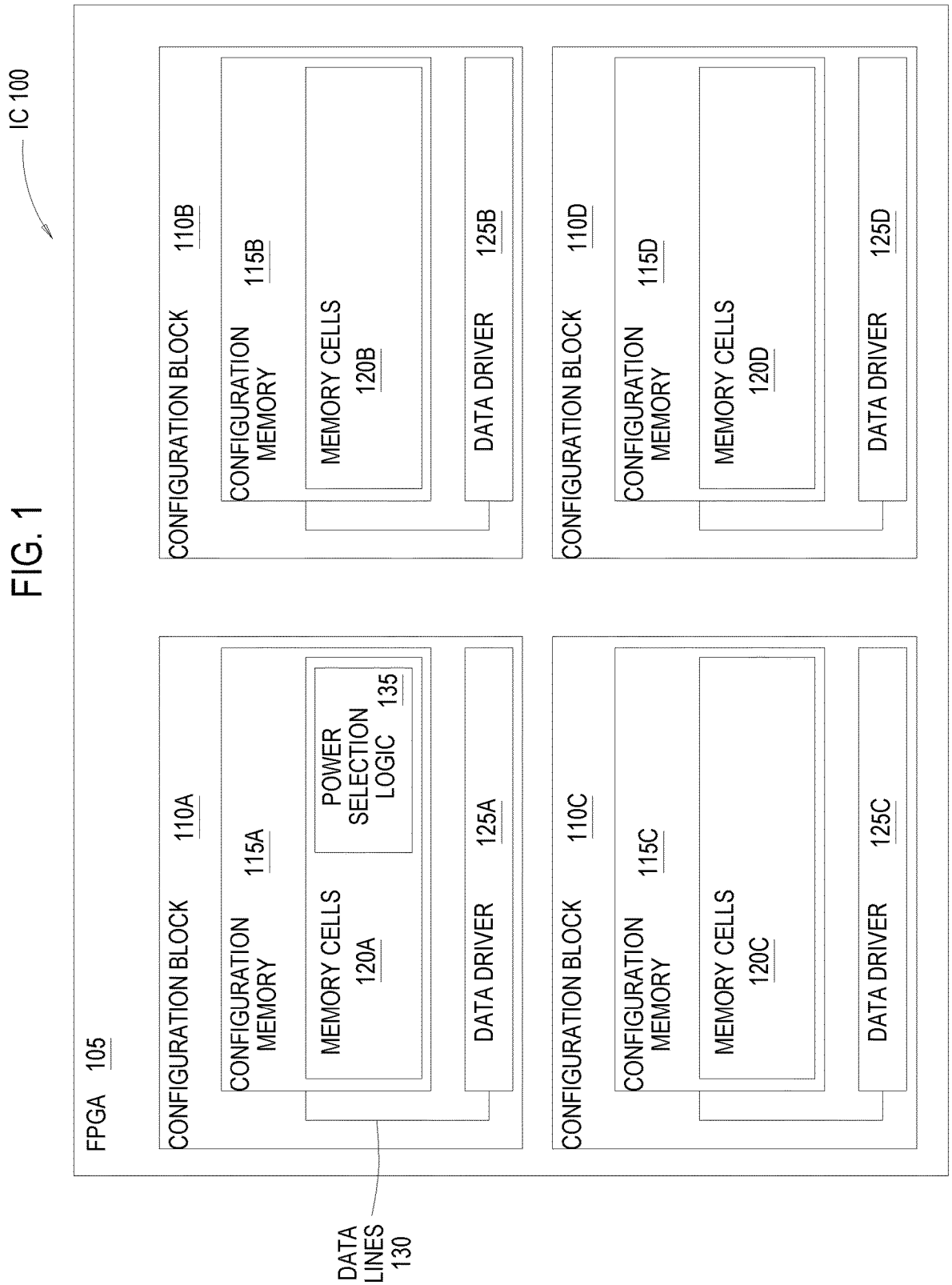
FIG. 1 is a block diagram of an integrated circuit comprising memory cells, according to an example.

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the description or as a limitation on the scope of the claims. In addition, an illustrated example need not have all the aspects or advantages shown. An aspect or an advantage described in conjunction with a particular example is not necessarily limited to that example and can be practiced in any other examples even if not so illustrated, or if not so explicitly described.

Embodiments herein describe a memory cell (e.g., a SRAM memory cell) that includes power selection logic for disconnecting storage inverters from a reference voltage source when writing data into the cell. In one embodiment, the memory cells may be disposed long distances (e.g., more than 100 microns) from the data drivers in the integrated circuit which can result in the data lines having large RC time constants as described above. For example, the memory cells may be part of configuration logic in a field programmable gate array (FPGA) which are used to configure programmable logic (also referred to as configuration blocks). Because the programmable logic can be spread throughout the FPGA, so are the memory cells which store the configuration logic. As a result, the data drivers may be disposed far away from the memory cells which results in large RC time constants.

In one embodiment, disconnecting the memory cells from the reference voltage source may counter (or mitigate) the large RC time constants of the data lines. To change the state of the memory cell (e.g., to change the cell from storing a first logical value to a second logical value), the data lines may need to flip the state of storage inverters in the cell by overcoming an internal voltage in the inverters. Put differently, the voltage on the data line fights with an internal voltage being driven by the inverters to change the voltage on the node from a first logical value to a second logical value. Although the memory cell can be designed such that internal voltage driven by the inverters is weak, the large RC time constant of the data line can reduce the write margin. Instead, disconnecting the inverters from the reference voltage source using the power selection logic when writing data effectively stops the internal voltage driven by the inverter, and thus, means the voltage on the data line does not fight an internal voltage of the inverter. As a result, the large resistance of the data line does not negatively impact the write margin of the memory cell. As such, the system can avoid placing buffers along the data lines, or at least, reduce the number of buffers needed relative to using memory cells that do not include the power selection logic.

FIG. 1 is a block diagram of an integrated circuit (IC) 100 comprising memory cells 120, according to an example. In this example, the IC 100 includes a FPGA 105 which has several configuration blocks 110A-D which are distributed throughout the IC 100. Although not shown, the configuration blocks 110 can include programmable logic which is configured when the FPGA is booted up to perform a desired user function.

Each of the configuration blocks 110 includes configuration memory 115 which stores the data used to configure the programmable logic to perform the desired user function. For example, the configuration memory 115 may contain data for configuring the configuration blocks 110 into a machine learning application, a hardware accelerator, a digital signal processor, etc. In addition to each configuration block 110 containing respective configuration memories 115, the memory cells 120 forming the configuration memories 115 may be distributed throughout the configuration blocks 110. That is, instead of being disposed at a centralized location in the IC 100 or within each of the configuration blocks 110, the memory cells 120 may be disposed through the IC 100 and the configuration blocks 110.

FIG. 1 also illustrates that each configuration block 110 can include one or more data drivers 125 for driving data onto the memory cells 120—e.g., to store the configuration data into the cells 120. Because the memory cells 120 can be distributed, data lines 130 coupling the data drivers 125 to the memory cells 120 can be lengthy, which results in large resistances and can decrease write margins. However, to counter these large resistances, the memory cells 120 include power selection logic 135 which disconnects the memory cells 120 from a power supply in the cells 120 when writing data. As a result, there is little to no contention between the data lines 130 and internal voltages being driven by the memory cells 120 when writing data. In one embodiment, each of the data lines 130 is buffered using multiple data drivers rather than only the data drivers 125A-D shown here.

Although FIG. 1 illustrates placing power selection logic 135 in configuration memory 115 for an FPGA 105, the embodiments herein are not limited to such. The power selection logic 135 can be used in any integrated circuit which has large resistances or RC time constants associated with the data lines 130. These large resistances can result from long routing distances from the data drivers 125 to the memory cells or from other means (e.g., smaller width data lines 130 or indirect routing paths). Further, the memory cells 120 are described as being SRAM memory cells but can apply to other types of memory.

Figure 2:
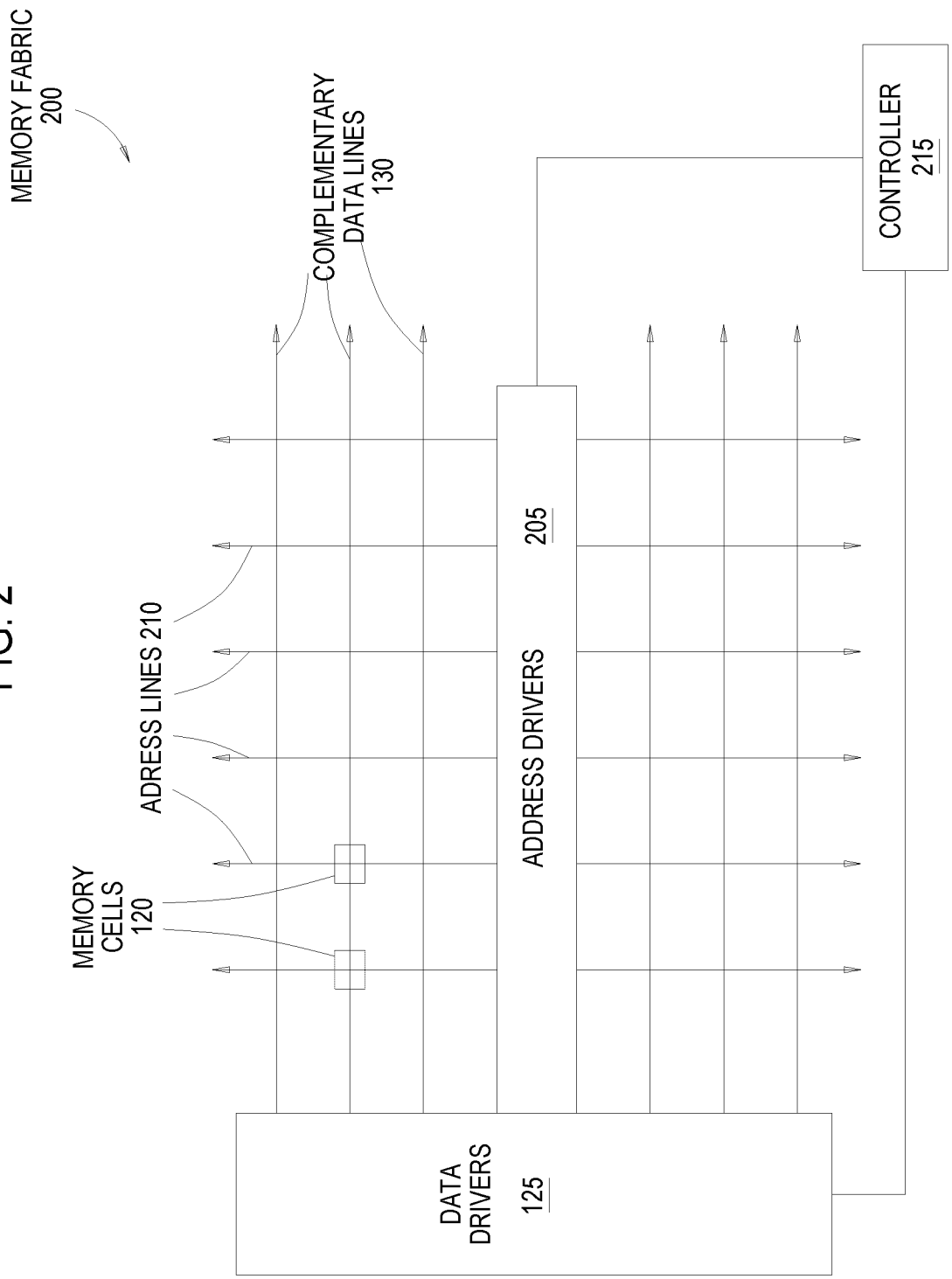
FIG. 2 illustrates data and address drivers for reading and writing to multiple memory cells, according to an example.

FIG. 2 illustrates data and address drivers for reading and writing to multiple memory cells, according to an example. FIG. 2 illustrates a memory fabric 200 which includes data drivers 125 coupled to a plurality of complementary data lines 130. That is, each of the lines 130 in FIG. 2 illustrates a pair of complementary data lines—i.e., D and D bar (or D not). The memory fabric 200 also includes address drivers 205 which control address lines 210 which activate (or deactivate) the memory cells 120. Although only two memory cells are shown, a memory cell 120 can be disposed at each intersection between the address lines 210 and a complementary pair of data lines 130.

A central controller 215 can synchronize the data drivers 125 and the address drivers 205 to write and read data from the memory cells. For example, to write data to a memory cell 120, the central controller 215 instructs the data drivers 125 to transmit the data to be written on one of the pairs of complementary data lines 130. As such, this data reaches all of the memory cells 120 disposed on the same row as the complementary data lines 130. Using the address drivers 205, the central controller 215 can activate one of the address lines 210 which activates all of the memory cells 120 along the column that includes the cell which should store the data. That is, the selected address line 210 activates only one memory cell 120 in each row, and as such, only the memory cell 120 disposed at the intersection between the active pair of complementary data lines 130 and the active address line 210 stores the data. Reading data from one of the memory cells 120 works in a similar manner except that the complementary data lines 130 are used to transmit a stored data value from the selected memory cell 120 to the data drivers 125 which forwards the data to the central controller 215.

As mentioned above, the distance between the data drivers 125 and the memory cells 120 and the resulting length of the complementary data lines 130 can negatively affect the write margins and write speeds of the memory cells 120. However, the power selection logic in the memory cells 120 can counter or mitigate these large resistances.

Figure 3:
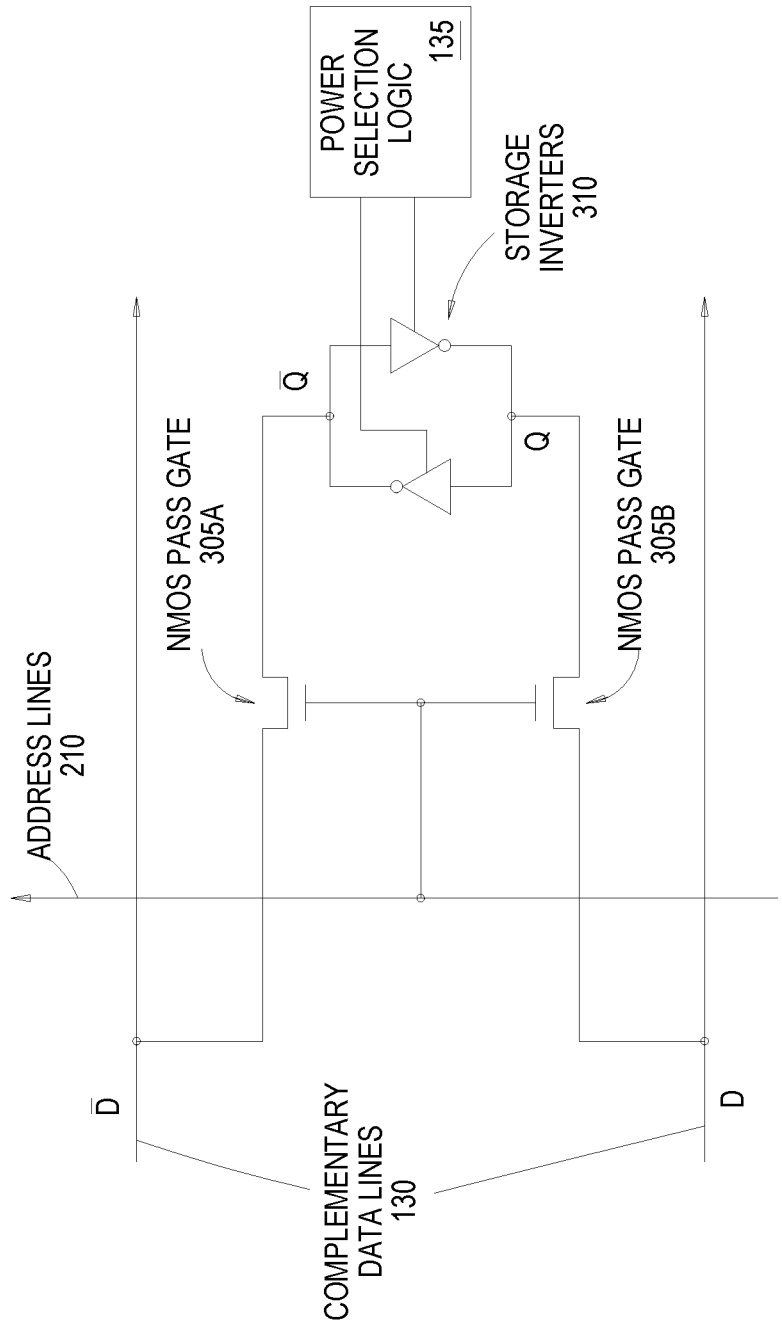
FIG. 3 illustrates a memory cell with power selection logic, according to an example.

FIG. 3 illustrates a memory cell 120 with power selection logic 135, according to an example. In this example, the memory cell 120 is a SRAM memory cell which includes storage inverters 310 where the output of each inverter is used as an input to the other inverter. As such, the outputs of the inverters—i.e., Q and Q bar—are inverses and determine the data value stored in the memory cell 120. That is, if Q has a low voltage (e.g., a "0") and Q bar has a high voltage (e.g., a "1"), the memory cell 120 stores a first logical value (e.g., a digital zero). However, if Q has high voltage and Q bar has a low voltage, the memory cell 120 stores a second logical value (e.g., a digital one).

The storage inverters 310 are selectively coupled to the complementary data lines 130 (i.e., D and D bar) by two NMOS pass gates 305. The gates of both the NMOS pass gates 305 are controlled by an address line 210. If the address line 210 has a high voltage (e.g., the memory cell 120 is selected or active), the NMOS pass gates 305 selectively couple the storage inverters 310 to the data lines 130. As such, the data lines 130 can either write data to the storage inverters (e.g., flip the state of Q and Q bar) or read data from the storage inverters (e.g., detect the current state of Q and/or Q bar). When the address line 210 has a low voltage, the NMOS pass gates 305 disconnect the storage inverters 310 from the data lines 130.

The power selection logic 135 selectively couples each of the inverters 310 to a DC power supply. When writing data to the memory cell—i.e., when the values of D and D bar are used to set the values of Q and Q bar—the power selection logic 135 can disconnect the inverters 310 from the power supply for at least a portion of the write period which avoids a potential fight (or contention) between the data lines 130 and the voltage at internal nodes being driven by the inverters 310. For example, if Q=1, Q bar=0, D=0, and D bar=1 when writing to the memory cell 120, then the voltages of D and D bar attempt to flip the state of the memory cell where Q=0 and Q bar=1. To do so, the voltage of D (which is 0) should overcome the current voltage of the node labeled Q. However, the voltage of Q (which is a 1) is being driven by the right inverter of the storage inverters. That is, the voltage outputted by the right inverter (e.g., 1) fights the voltage of the bottom data line (i.e., D) which is a 0. Although the inverter can be designed to weakly pull up the voltage at the Q node so that it is more easily overcome by the voltage of the data line 130, data lines 130 can have which large resistances may struggle to change the voltage at the node, and thus, flip the state of the storage inverters 310.

In the embodiments herein, the memory cell 120 can disconnect the storage inverters 310 from the power supply which effectively prevents the right inverter from maintaining the voltage at node Q, thereby avoiding a fight between the storage inverters 310 and the data lines 130. Because there is no or little contention, the negative effect of the resistance of the data line 130 is mitigated or reduced.

Although the power selection logic 135 is shown coupled to both of the inverters 310, in one embodiment, the power selection logic 135 may be coupled to only one of the inverters 310. Further, in another embodiment, the power selection logic 135 may selectively couple one or both of the inverters 310 to ground. That is, when writing data to the memory cell 120, the logic 135 may disconnect one or both of the inverters 310 from ground. Regardless which voltage or power supply the power selection logic 135 is coupled to, in one embodiment, the power selection logic 135 keeps the storage inverters 310 coupled to the power supply or ground when reading data from the memory cell 120. That is, in one embodiment, the power selection logic 135 may deactivate the inverters 310 by disconnecting the inverters 310 from a power supply or ground only when writing data to the memory cell 120.

Figure 4:
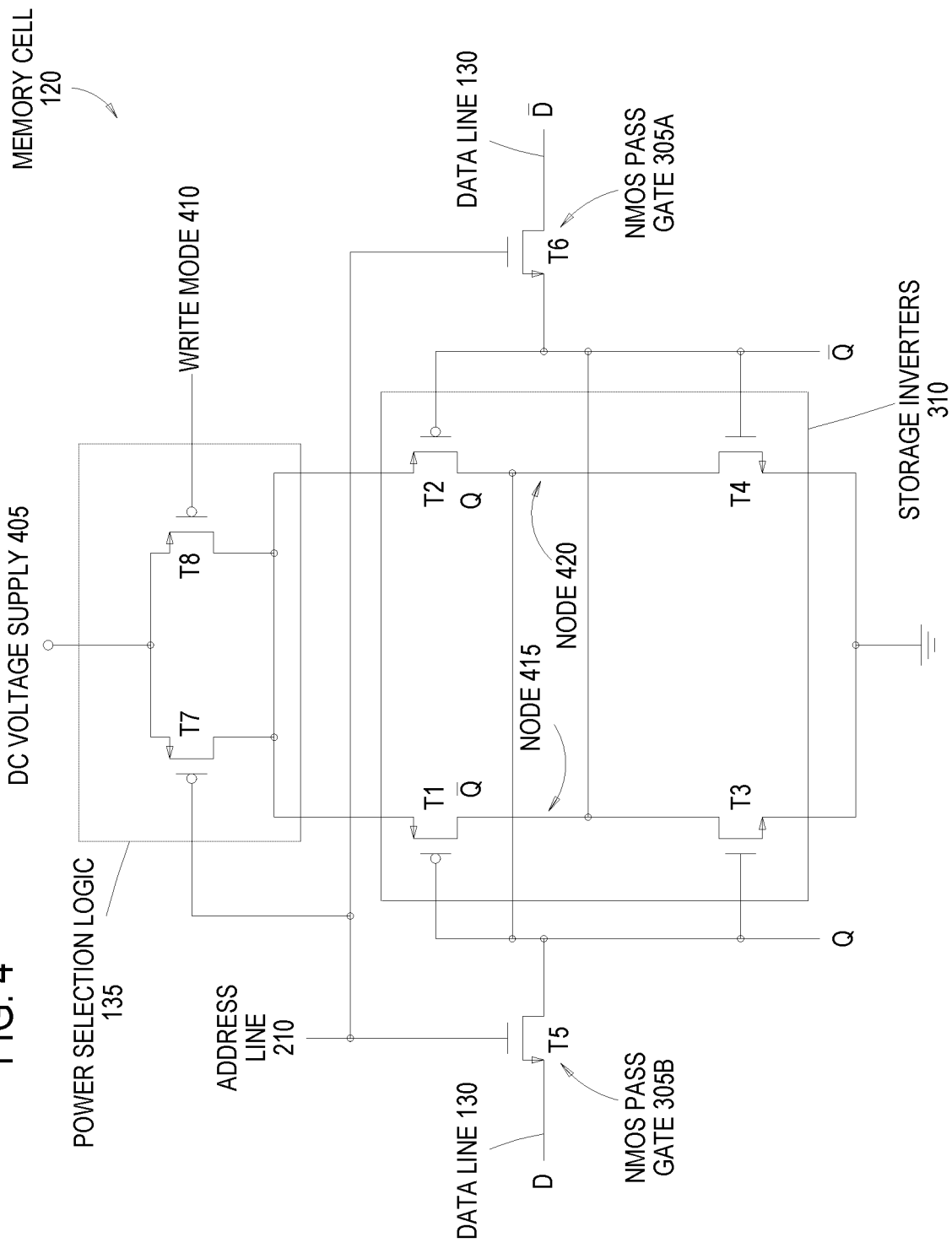
FIG. 4 is a circuit of a memory cell with power selection logic, according to an example.

FIG. 4 is a circuit of a memory cell 120 with power selection logic 135, according to an example. The storage inverters 310 are formed using two pairs of transistors where the transistors T1 and T3 form a first inverter and the transistors T2 and T4 form a second inverter. The transistors T1 and T2 are PMOS while the transistors T3 and T4 are NMOS. The output of the first inverter formed from the transistors T1 and T3 is labeled as Q bar and is connected to the input of the second inverter—i.e., the gates of the transistors T2 and T4. Similarly, the output of the second inverter formed from the transistors T2 and T4 is labeled Q and is connected to the input of the first inverter—i.e., the gates of the transistors T1 and T3. As such, the voltage of Q is inverted from the voltage of Q bar.

The left data line 130 is labeled D while the right data line 130 is labeled D bar and have complementary or inverted voltages. Each of the data lines 130 are selectively coupled to an input of one of the inverters 310 by the NMOS pass gates 305. That is, the D data line 130 is coupled to the gates of the transistors T1 and T3 via the pass gate 305B, while the D bar data line 130 is coupled to the gates of the transistors T2 and T4 via the pass gate 305A. The gates of the pass gates 305 are both coupled to the address line 210, and thus, are activated and deactivated in synch.

In FIG. 4, the power selection logic 135 includes PMOS transistors T7 and T8 which provide parallel electrical paths to a DC voltage supply 405 (e.g., a reference voltage source) for powering the inverters 310. Put differently, so long as at least one of the transistors T7 and T8 is active, the DC voltage supply 405 powers the inverters 310 and the inverters 310 drive voltages at their outputs—i.e., the output node 415 (or internal node) between the drain of the transistor T1 and the drain of the transistor T3 and the output node 420 (or internal node) between the drain of the transistor T2 and the drain of the transistor T4. Deactivating both of the transistors T7 and T8, however, de-powers the inverters 310 which prevents the inverter outputting a high voltage (e.g., a 1) from continuing to drive the voltage at its output node. For example, if Q bar=1, then deactivating both of the transistors T7 and T8 means that this voltage is no longer driven by the transistor T1 at the output node 415 and then onto the input gates of the transistors T2 and T4. As described below, this makes it easier for the D bar data line 130 (which is also coupled to the input gates of the transistors T2 and T4 and the output node 415) to change the voltage from the high voltage to the low voltage—i.e., a 0. By so doing, the data lines 130 can flip the state of the storage inverters 310 where Q bar is now 0 and Q is now 1.

Figure 5:
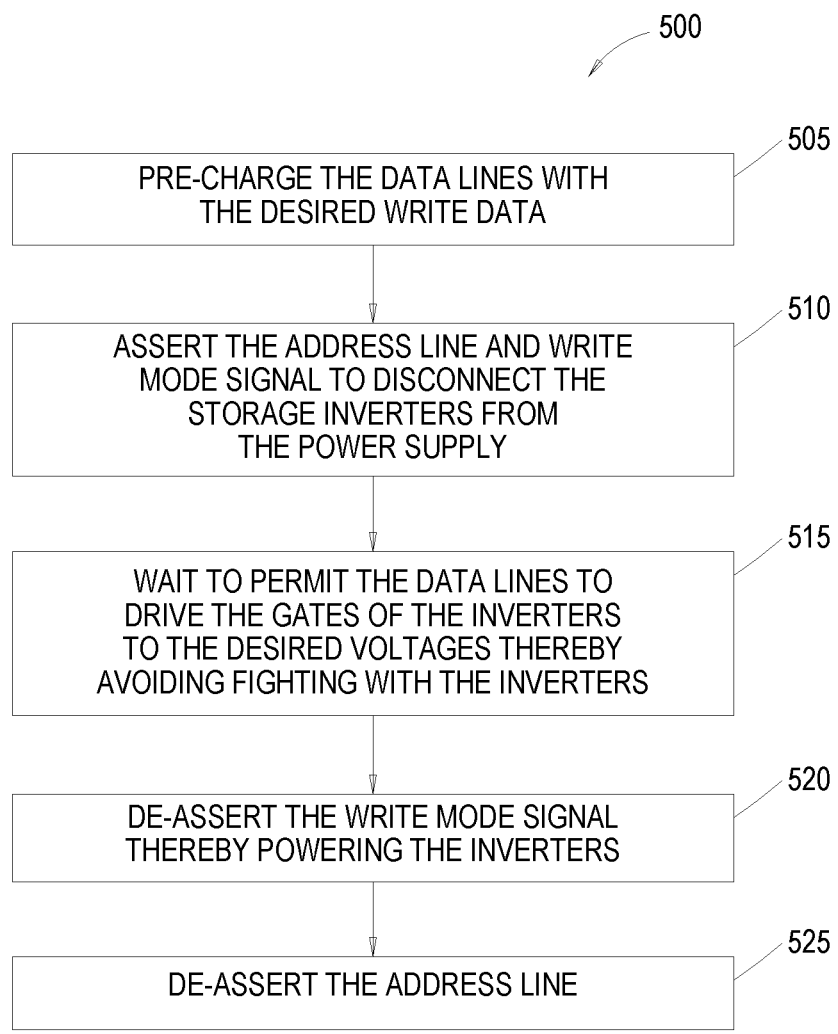
FIG. 5 is a flowchart for disconnecting storage inverters in a memory cell from a reference voltage source when writing data, according to an example.

FIG. 5 is a flowchart of a method 500 for disconnecting storage inverters in a memory cell from a reference voltage source when writing data, according to an example. For clarity, the blocks of method 500 are discussed in parallel with the memory cell 120 illustrated in FIG. 4. At block 505, a controller pre-charges the data lines 130 with the desired write data. That is, the data line drivers begin to drive the desired write data onto the complementary data lines. That is, the data drivers drive the voltages corresponding to D=1 and D bar=0 or D=0 and D bar=1 onto the data lines 130. In this example, it is assumed that D=1 and D bar=0 and the current state of the memory cell 120 at the nodes 415 and 420 is Q=0 and Q bar=1. As such, when writing the data, the data lines 130 attempt to flip the state of the memory cells such that Q=1 and Q bar=0.

Figure 6:
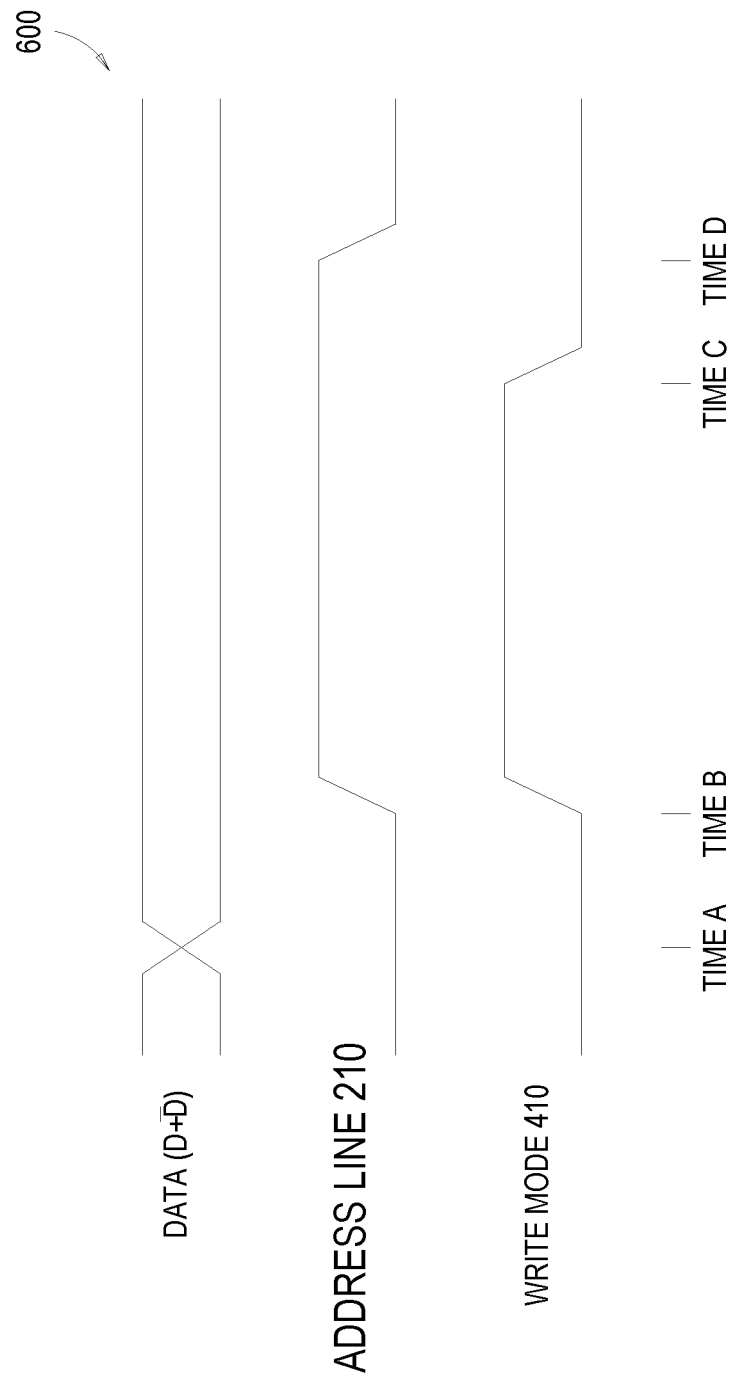
FIG. 6 is a timing chart for writing data to a memory cell, according to an example.

FIG. 6 is a timing chart 600 for writing data to a memory cell using the method 500 in FIG. 5, according to an example. In the chart 600, Time A corresponds to block 505 where the voltages of the data lines 130 (D and D bar) are set to the desired write values.

At block 510, the controller asserts the address line 210 and the write mode signal 410 to disconnect the storage inverters 310 from the power supply—e.g., the DC voltage supply 405. Asserting the address line 210 activates that NMOS pass gates 305 such that the data lines 130 are electrically coupled to the gates of the transistors T1-T4 forming the storage inverters 310. However, as shown in FIG. 4, the gates of the transistors T1-T4 are also coupled to the output of the inverters 310 at nodes 415 and 420. That is, in addition to the gates of transistors T1 and T3 being coupled to the D data line 130, these gates are also coupled to the output of the inverter formed by the transistors T2 and T4 (e.g., the Q state). Since at the beginning of the write the voltage of the D data line is a 1 and Q is 0, these voltages would fight to determine the value at the gates of the transistors T1 and T3. A similar fight or contention takes place between the D bar data line and Q bar at the gates of the transistors T2 and T4.

However, because both the address line 210 and the write mode 410 is high, these signals turn off the transistors T7 and T8 which prevents the transistor T2 from continuing to drive the voltage at the output node 420. As such, the value of Q (which may have some small latent charge) has little or no effect on the gate voltages at the transistors T1 and T3. Put differently, the values of the gates voltages are determined by the voltage on the D data line 130. Thus, contention in avoided.

The timing chart 600 in FIG. 6 illustrates that block 510 occurs at Time B where the voltages on the address line 210 and the write mode 410 switch to a high voltage thereby deactivating the PMOS transistors T7 and T8 and disconnecting the inverters 310 from the DC voltage supply 405.

At block 515, the memory cell 120 waits to permit the data lines to drive the gates of the inverters to the desired voltages while avoiding contention. That is, from Time B to Time C, the storage inverters 310 are disconnected from the DC voltage supply 405. Thus, the D data line 130 is free to change the voltage on the output node 415 (i.e., the value of Q bar) from a 1 to a 0. That is, because D=1, the NMOS transistor T3 is activated which connects the node 415 to ground. In parallel, the D bar data line 130 (where D bar=0) decreases the gate voltages of transistors T2 and T4 until eventually, the NMOS transistor T4 is deactivated thereby insulating the node 420 from ground (e.g., 0 voltage). There may be some contention between the transistor T4 and the data lines 130 since the transistor T4 couples the output node 420 to ground until it is deactivated by its gate voltage. The pull down path formed by the transistor T6 and the data driver is stronger than the pull up path formed by transistors T1 and T2 to allow for writing low side (0) into the cell. Disconnecting power for PMOS makes the pull up path even weaker. The D date line 130 can also drive up the output node 420 to its voltage such that Q now is 1. As such, the data lines 130 have flipped the state of the storage inverters 310 such that Q=1 and Q bar=0.

At block 520, the controller de-asserts the write mode signal thereby powering the inverters. That is, at Time C in the timing chart 600, the write mode signal 410 goes low which activates the transistor T8 such that the DC voltage supply 405 is connected to the sources of the PMOS transistors T1 and T2. Because the value of the D data line 130 is 1, the transistor T1 remains inactive. However, because the value of the D bar data line 130 is 0, the transistor T2 is now active and drives the output node 420 to the voltage of the DC voltage supply 405 (i.e., a 1). Thus, at Time C, the storage inverters 310 can store the current state of the memory cell (e.g., Q=1 and Q bar=0) without aid from the voltages on the data lines 130.

At block 525, the controller de-asserts the address line. That is, at Time D in the timing chart 600, the address line 210 goes low which deactivates the pass gates 305 and decouples the data lines 130 from the gates of the transistors T1-T4 and from the output nodes 415 and 420. Using the DC voltage supply 405 and ground, the storage inverters 310 can maintain the state of the outputs nodes 415 and 420 (i.e., Q and Q bar).

Figure 7:
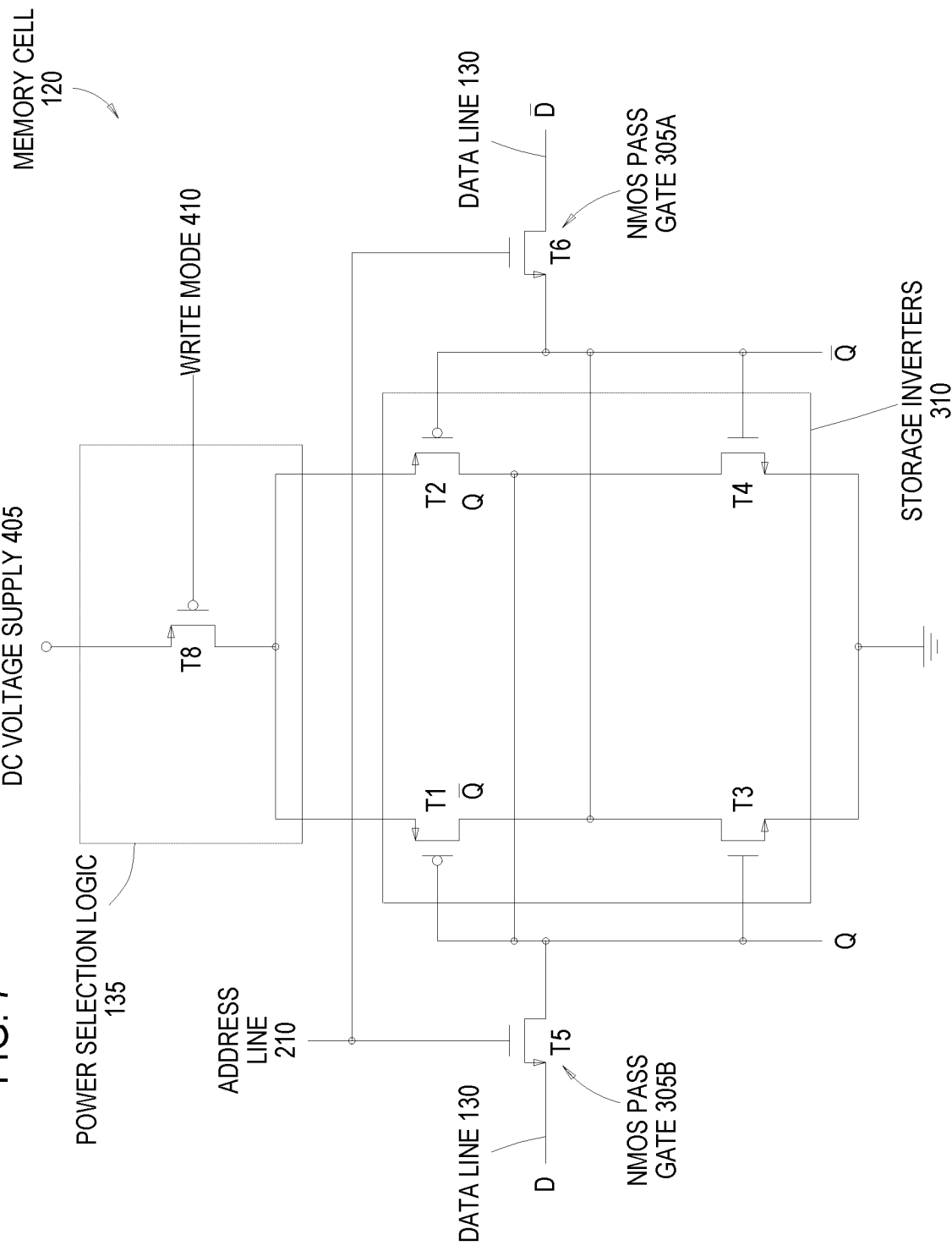
FIG. 7 is a circuit of a memory cell with power selection logic, according to an example.

FIG. 7 is a circuit of a memory cell 120 with power selection logic 135, according to an example. The memory cell 120 in FIG. 7 is the same as the memory cell in FIG. 4 except that the power selection logic 135 includes one fewer PMOS transistor. That is, the transistor T7 which is controlled by the address line 210 in FIG. 4 has been omitted. Instead, the DC voltage supply 405 is coupled to the storage inverters 310 only through the transistor T8 which is controlled by the write mode signal 410.

The circuit in FIG. 7 may be preferred when using a write mode signal 410 which is individually addressable. That is, if the write mode signal 410 is decoded by the controller such that the controller can selectively apply the write mode signal 410 to only the memory cell 120 which is being written, then using one transistor in the power selection logic 135 is sufficient. However, if the write mode signal 410 is a global signal (or at least, is sent to multiple transistors in parallel), then the circuit in FIG. 4 may be preferred. For example, if the write mode signal 410 is sent to multiple memory cells that have the same circuit configuration as shown in FIG. 7, when the write mode signal 410 goes high, the storage inverters in all of the memory cells are disconnected from the DC voltage supply 405 which can introduce errors in the states of the output nodes of the inverters (e.g., cause the state of the storage inverters to flip). Instead, if using the circuit configuration in FIG. 4, if the same write mode signal 410 is sent to multiple memory cells, the respective transistors T8 are deactivated but the only the memory cell 120 that is being written to (i.e., the memory cell 120 where the address line 210 has gone high) is fully disconnected from the DC voltage supply 405. The address lines 210 for the remaining memory cells 120 stay low which keeps their respective storage inverters 310 coupled to the DC voltage supply 405. Put differently, the transistor T7 maintains a parallel electrical path for powering the inverters 310 even when a global write mode signal 410 deactivates the transistor T8. Thus, memory cells 120 that are not being written to remain powered.

In one embodiment, the area saved from removing the transistor T7 as shown in FIG. 7 may be used to add additional track or wires for n address lines where n+1 instead of 2*n. In one embodiment, the decision between using the circuit in FIG. 4 or the circuit in FIG. 7 depends on the address driver implementation and the chosen layout style.

Figure 8:
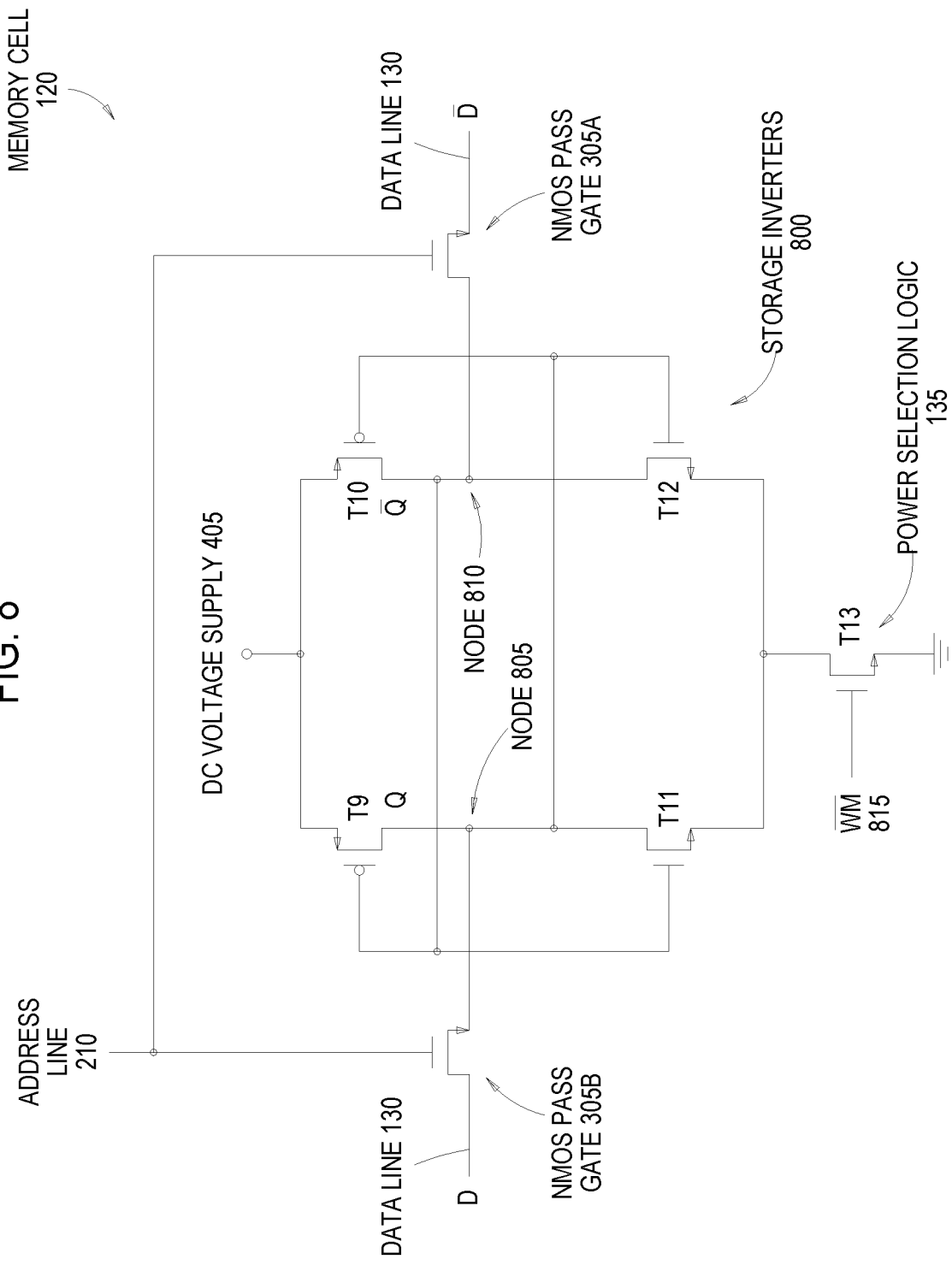
FIG. 8 is a circuit of a memory cell with power selection logic, according to an example.

FIG. 8 is a circuit of a memory cell 120 with power selection logic 135, according to an example. In this example, instead of selectively coupling storage inverters 800 to the DC voltage supply, the power selection logic 135 includes a transistor T13 which selectively couple the storage inverters 800 to ground. Ground and the DC voltage supply 405 in FIGS. 4 and 7 can be referred to as reference voltages or reference voltage sources. Thus, the power selection logic 135 selectively couples the transistors in the storage inverters to a reference voltage source, whether that is the DC voltage supply (which can be a positive or negative voltage) in FIGS. 4 and 7 or ground as shown in FIG. 8.

In this example, the D data line 130 is coupled to an output node 805 of the inverter formed by the transistors T9 and T11. Because the output node 805 is also electrically connected to the gates (or inputs) of the transistors T10 and T12, this means the D data line 130 is also coupled to those gates, and thus, can control an output node 810 (e.g., the Q bar value) of the inverter formed by the transistors T10 and T12.

The D bar data line 130 is coupled to the output node 810 and to the gates of the transistors T9 and T11. As such the value of D bar affects the output node 805 (e.g., the Q value).

The transistor T13 is controlled by the write mode (WM) bar signal 815. That is, the WM bar signal 815 is opposite or the inverse of the write mode signal 410 in FIGS. 4 and 7. When the WM bar signal 815 is low, the NMOS transistor T13 is deactivated and the drains of the transistors T11 and T12 are disconnected from ground. However, when the WM bar signal 815 is high, the transistor T13 is active and the transistors T11 and T12 are connected to ground. Like the circuits in FIGS. 4 and 7, the power selection logic 135 can selectively connect and disconnect the storage inverters 800 when writing data to the memory cell 120 to avoid contention between the internal nodes of the storage inverters 800 (e.g., the nodes 805 and/or 810) and at least one of the data lines 130.

Figure 9:
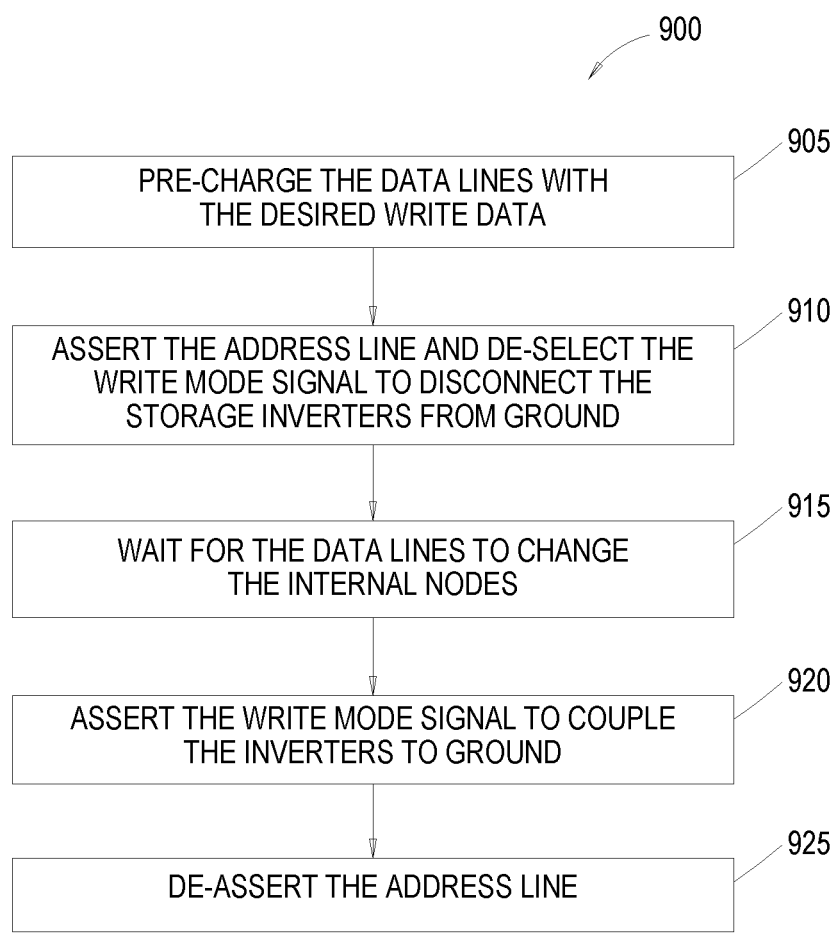
FIG. 9 is a flowchart for disconnecting storage inverters in a memory cell from a reference voltage source when writing data, according to an example.

FIG. 9 is a flowchart of a method 900 for disconnecting storage inverters in a memory cell from a reference voltage source when writing data, according to an example. For ease of explanation, the method 900 is discussed in parallel with the circuit shown in FIG. 8.

At block 905, the controller pre-charges the data lines 130 with the desired write data. In one embodiment, the circuit in FIG. 8 provides easy writing of 1 into the cell (either as the Q value or the Q bar value). That is, the circuit in FIG. 8 makes it easier for the data lines 130 to cause one of the inverters 800 to output a 0 at one of the output nodes 805 and 810.

Figure 10:
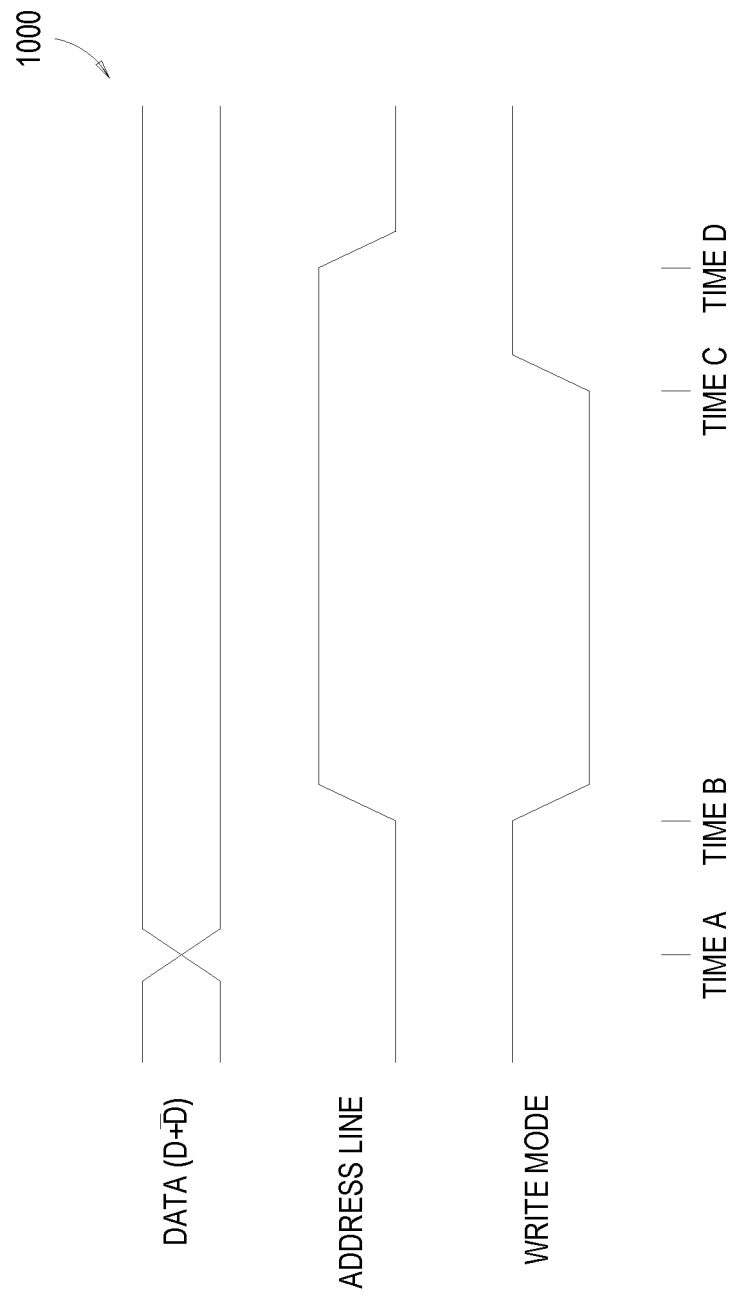
FIG. 10 is a timing chart for writing data to a memory cell, according to an example.

FIG. 10 is a timing chart 1000 for writing data to a memory cell, according to an example. Time A corresponds to block 905 where the controller pre-charges the data lines 130 with the desired data. As an example, assume that D=1, D bar=0, Q=0, and Q bar=1. As such, the data lines 130 are attempting to flip to the state of the inverters 800 such that Q=1 and Q bar=0.

At block 910, the controller asserts the address line 210 and de-asserts the write mode signal to disconnect the storage inverters from ground. This is illustrated at Time B of the chart 1000 where the address line 210 goes high which couples the data lines 130 to the respective output nodes 805 and 810 of the inverters 800. In parallel, the write mode (i.e., the WM bar signal 815) goes low which deactivates the transistor T13 and disconnects the inverters 800 from ground.

Now that the data lines 130 are coupled to the inverters 800, the data lines 130 attempt to flip the voltage at the output nodes 805 and 810. Right before Time B (because of the previous state of the inverters 800), the transistor T11 is active (which couples Q to ground) and the transistor T10 is active (which couples Q bar to the DC voltage supply 405), thereby setting Q=0 and Q bar=1. However, by disconnecting the inverters 800 from ground at Time B, the voltage of Q at the node 805 is no longer tied to ground. Instead, the value of the D data line 130 (e.g., 1) is driven onto the node 805 and onto the gates of the transistors T10 and T12. That is, the voltage of the D data line 130 does not have to fight or contend with the transistor T11 to change the voltage at the node 805 and at the gates of the transistors T10 and T12. Stated differently, the D data line 130 drives the internal node 805 to a 1 which weakens the PMOS pullup transistor T10. It then is easier for the D bar data line 130 to pull down the weakened PMOS pull up transistor T10.

At block 915, the memory cell waits for the data lines to change the internal nodes. That is, the voltage on the D data line 130 can easily drive the gates of the transistor T10 and T12 which deactivates the transistor T10 since D=1 (and disconnects Q bar and the node 810 from the DC voltage supply 405). This aids the D bar data line 130 to change the gate voltages of the transistors T9 and T11 to activate the transistor T9 thereby driving the node 805 to the DC voltage supply 405 to a 1 (which is the same value as D). This period is shown in the timing chart 1000 as the time between Time B and Time C.

At block 920, the controller asserts the write mode signal (e.g., raises it to a high voltage) to couple the inverters 800 to ground. This is shown as Time C in the chart 1000. Doing so helps (or ensures) that the transistor T11 is deactivated and that the transistor T12 is activated. As a result, the state of the inverters 800 has been flipped to Q=1 and Q bar=0. Once settled, the inverters 800 can be disconnected from the data lines 130 and still maintain that same state.

At block 925, the controller de-asserts the address line 210 as shown at Time D of the chart 1000 which deactivates the pass gates 305 and disconnects the data lines 130 from the inverters 800. This completes the write process and the data lines 130 can be used to write data to a different memory cell in the row.

Of course, the method 900 operates in a similar manner if the values are reversed where D=0, D bar=1, Q=1 and Q bar=0. In this example, the value of D bar does not have to fight or contend with the transistor T12 (since it is disconnected from ground) at the node 810. This make it easier from the D bar data line 130 to control the gate voltages of the transistors T9 and T11 and deactivate the transistor T9 in order to flip the state of the inverters to Q=0 and Q bar=1.

The circuit in FIG. 8 may have an advantage over the circuit in FIG. 7 if the memory cell 120 already stores the same value as the data lines 130 when performing a write (i.e., D=Q and D bar=Q bar). Referring to FIG. 7, when disconnecting the DC voltage supply 405, the Q/Q bar value may temporarily lose its full voltage value. For example, if Q=1, then deactivating the transistor T8 means that Q is not connected to the DC voltage supply 405. If the memory cell 120 is currently being written, this is not a problem since the value of the D data line 130 (which is also a 1) keeps the voltage. However, disconnecting the 1 side Q/Q bar value can be undesirable if the stored value of some memory cells are used during the same write operation while the values of other cells which share the same address are being updated (e.g., a partial reconfiguration). For the other cells which may not be connected to the data lines 130 (but are nonetheless disconnected from the DC voltage supply 405 because they have the same address), the value of Q can drop or droop. Using the NMOS transistor T13 for the power selection logic 135 as shown in FIG. 8 avoids this potential problem. Moreover, the circuit in FIG. 4 also avoids this problem because of the parallel connection provided by the transistor T7 to the DC voltage supply 405 which is controlled by the address line 210.

Figure 11:
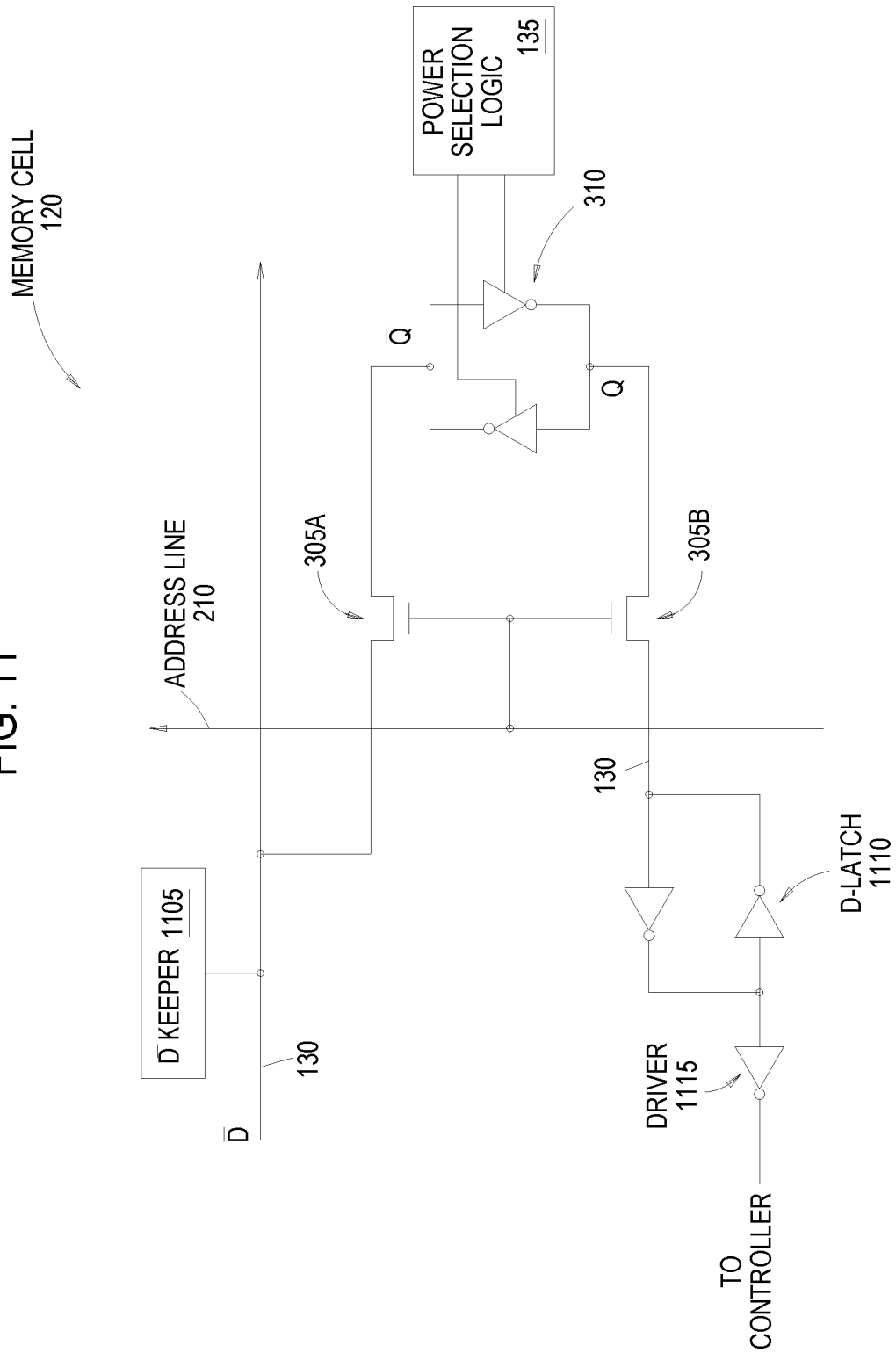
FIG. 11 illustrates the circuitry used for reading data from a memory cell, according to an example.

FIG. 11 illustrates the circuitry used for reading data from a memory cell 120, according to an example. The memory cell 120 includes the same circuitry as FIG. 3 but with the additions of a D bar keeper circuit 1105, a D-latch 1110, and a driver 1115. When reading the state of Q and Q bar (to determine the data stored in the inverters 310), the controller pre-charges the D and D bar data lines 130 to a default read state. The D bar keeper circuit 1105 weakly maintains the D bar data line 130 in a default state—e.g., 1. Moreover, the initial state of the D data line may be 1 and the inverters 310 store a state where Q=1 and Q bar=0. The address line 210 goes high which connects the outputs of the inverters 310 to the D and D bar data lines 130 by activating the pass gates 305. Q bar will pull down the D bar voltage to 0 while Q pulls up D to 1. This is latched in the D-latch 1110 and then transmitted to the controller by the driver 1115 to indicate the current state of the memory cell 120.

If Q=0 and Q bar=1, when the address line 210 couples the inverters 310 to the data lines 130, Q changes the initial state of D (e.g., a 1) to a 0. That is, the pull-up in the D-latch 1110 is weak so that it can be overcome by the output of the inverters 310. Because D is now 0, the output of the D-latch 1110 sent to the driver 1115 (e.g., inverter) is a 1, which is then inverted back to a 0 and sent to the controller. In this manner, the controller can read the data stored in the memory cell 120. In one embodiment, D is driven by a latch so that the address line 210 can be de-asserted earlier without waiting for data to reach the central controller.

In the embodiments above, the data lines 130 may be implemented without using intermediate buffers between the data drivers and the memory cell 120 for reducing the RC time constant or resistance of the data lines 130. As a result, the data lines avoid extra circuitry which take up valuable real estate and may be difficult or impossible to test. However, in other embodiments, the data line 130 may include intermediate buffers, but may use less buffers relative to using SRAM memory cells 120 which do not include the power selection logic 135 discussed above.

While the foregoing is directed to specific examples, other and further examples may be devised without departing from the basic scope thereof, and the scope thereof is determined by the claims that follow.

What is claimed is:

1. A memory cell, comprising:
    at least one data line;
    at least one address line;
    a pair of storage inverters where an output of a first inverter is coupled to an input of a second inverter and an output of the second inverter is coupled to an input of the first inverter to save a state of the pair of storage inverters; and
    power selection logic coupled between a reference voltage source and the pair of storage inverters,
    wherein the memory cell is configured to:
       disconnect, during a write operation, at least one of the pair of storage inverters from the reference voltage source using the power selection logic, and
       drive desired data on the at least one data line when the at least one of the pair of storage inverters is disconnected from the reference voltage, wherein the at least one of the pair of storage inverters remains disconnected from the reference voltage until the state of the pair of storage inverters has been flipped by the at least one data line.

2. The memory cell of claim 1, wherein the power selection logic comprises a first transistor coupled at first end to the reference voltage source and coupled at a second end to a second transistor in the first inverter and to a third transistor in the second inverter.

3. The memory cell of claim 2, wherein a gate of the first transistor is controlled by a write mode signal, wherein the write mode signal disconnects the at least one of the pair of storage inverters from the reference voltage source in parallel with the at least one address line activating at least one pass gate to couple the at least one data line to the pair of storage inverters.

4. The memory cell of claim 3, wherein the power selection logic comprises a fourth transistor coupled at first end to the reference voltage source and coupled at a second end to the second transistor in the first inverter and to the third transistor in the second inverter, wherein a gate of the fourth transistor is coupled to the at least one address line, wherein the first and the fourth transistors are PMOS transistors.

5. The memory cell of claim 4, wherein the write mode signal is a global signal that is transmitted in parallel to multiple memory cells.

6. The memory cell of claim 3, wherein the reference voltage source is ground and the first transistor is an NMOS transistor.

7. The memory cell of claim 3, wherein the write mode signal is a decoded signal that is individually addressable to the memory cell.

8. The memory cell of claim 1, wherein disconnecting the at least one of the pair of storage inverters from the reference voltage source using the power selection logic prevents the at least one of the pair of storage inverters from driving a voltage on an internal node that counters a voltage of the desired data being driven on the at least one data line.

9. The memory cell of claim 8, wherein the memory cell is an SRAM memory cell.

10. The memory cell of claim 1, wherein the at least one data line is one of a pair of complementary data line, wherein each of the pair of complementary data lines is coupled to one of the inputs of the pair of storage inverters and one of the outputs of the pair of storage inverters.

11. A method, comprising:
    disconnecting, during a write operation, at least one of a pair of storage inverters in a memory cell from a reference voltage source using power selection logic, wherein an output of a first inverter is coupled to an input of a second inverter and an output of the second inverter is coupled to an input of the first inverter to save a state of the pair of storage inverters, and wherein the power selection logic is coupled between the reference voltage source and the pair of storage inverters; and
    driving desired data on a data line when the at least one of the pair of storage inverters is disconnected from the reference voltage, wherein the at least one of the pair of storage inverters remains disconnected from the reference voltage until the state of the pair of storage inverters has been flipped by the at least one data line.

12. The method of claim 11, further comprising:
    pre-charging the data line with the desired data before disconnecting the at least one of the pair of storage inverters from the reference voltage source.

13. The method of claim 11, further comprising:
    activating a pass gate to couple the data line to the pair of storage inverters using an address line in parallel with disconnecting the at least one of the pair of storage inverters in the memory cell from the reference voltage source.

14. The method of claim 13, further comprising:
    connecting the at least one of the pair of storage inverters in the memory cell to the reference voltage source while driving the desired data on the data line and before deactivating the pass gate to decouple the data line from the pair of storage inverters.

15. The method of claim 11, wherein disconnecting the at least one of the pair of storage inverters comprises disconnecting both the first inverter and the second inverter in the pair of storage inverters from the reference voltage source.

16. The method of claim 15, wherein disconnecting the at least one of the pair of storage inverters comprises:
    deactivating a first transistor coupled at first end to the reference voltage source and coupled at a second end to a second transistor in the first inverter and to a third transistor in the second inverter.

17. The method of claim 16, wherein a fourth transistor is coupled at first end to the reference voltage source and coupled at a second end to the second transistor in the first inverter and to the third transistor in the second inverter, wherein a gate of the fourth transistor is coupled to an address line, wherein the first and the fourth transistors are PMOS transistors.

18. The method of claim 17, further comprising:
    activating the first transistor to connect the first and second inverters to the reference voltage source; and
    activating the fourth transistor to connect the first and second inverters to the reference voltage source after activating the first transistor.

19. The method of claim 16, wherein the reference voltage source is ground and the first transistor is an NMOS transistor.

20. A memory cell comprising:
    a first inverter;
    a second inverter where an output of the first inverter is coupled to an input of a second inverter and an output of the second inverter is coupled to an input of the first inverter to save a state of the memory cell; and
    a transistor coupled at a first end to a reference voltage source and coupled at a second end to one of: (i) both drains of respective transistors in the first and second inverters and (ii) both sources of the respective transistors in the first and second inverters,
    wherein the memory cell is configured to disconnect, during a write operation, both the first and second inverters from the reference voltage source using the transistor until the state of the memory cell has been flipped.

* * * * *